(12) United States Patent
Matsuo

(10) Patent No.: US 8,031,016 B2
(45) Date of Patent: Oct. 4, 2011

(54) MULTIPLYING OSCILLATOR AND WIRELESS APPARATUS IN WHICH THE SAME IS INSTALLED

(75) Inventor: Michiaki Matsuo, San Jose, CA (US)

(73) Assignee: Panasonic Corporation, Osaka (JP)

( * ) Notice: Subject to any disclaimer, the term of this patent is extended or adjusted under 35 U.S.C. 154(b) by 78 days.

(21) Appl. No.: 12/519,654

(22) PCT Filed: Dec. 19, 2007

(86) PCT No.: PCT/JP2007/074452
§ 371 (c)(1),
(2), (4) Date: Jun. 17, 2009

(87) PCT Pub. No.: WO2008/084638
PCT Pub. Date: Jul. 17, 2008

(65) Prior Publication Data
US 2010/0090770 A1  Apr. 15, 2010

(30) Foreign Application Priority Data

Dec. 26, 2006 (JP) .................................. 2006-349689
Dec. 17, 2007 (JP) .................................. 2007-324514

(51) Int. Cl.
*H03B 5/12* (2006.01)

(52) U.S. Cl. ...... 331/107 SL; 331/107 DP; 331/117 FE; 331/154

(58) Field of Classification Search ............ 331/107 SL, 331/107 DP, 117 FE, 154
See application file for complete search history.

(56) References Cited

U.S. PATENT DOCUMENTS

| 5,138,284 | A | 8/1992 | Yabuki et al. |
| 6,549,082 | B2 * | 4/2003 | Ipek et al. ................ 331/57 |
| 7,119,625 | B2 * | 10/2006 | Aikawa et al. ......... 331/107 SL |
| 2004/0032303 | A1 | 2/2004 | Saito et al. |
| 2005/0174182 | A1 | 8/2005 | Aikawa et al. |
| 2007/0164830 | A1 | 7/2007 | Aikawa et al. |

FOREIGN PATENT DOCUMENTS

| JP | 04-175001 A | 6/1992 |
| JP | 2003-087052 A | 3/2003 |
| JP | 2003-110358 A | 4/2003 |
| JP | 2004-350021 A | 12/2004 |
| JP | 2005-217752 A | 8/2005 |
| JP | 2006-135563 A | 5/2006 |
| JP | 2007-194871 A | 8/2007 |

OTHER PUBLICATIONS

International Search Report for PCT/JP2007/074452.

* cited by examiner

*Primary Examiner* — Arnold Kinkead
(74) *Attorney, Agent, or Firm* — Pearne & Gordon LLP

(57) ABSTRACT

An object of the invention is to provide a multiplying oscillator capable of generating a high frequency signal by small circuit scale and power consumption in an oscillator for generating a signal with a frequency of a microwave band or more, and a local oscillator using this multiplying oscillator. A multiplying oscillator of the invention obtains a frequency signal four times or more a fundamental wave by adding a frequency adjusting unit 40 having a function of suppressing second harmonic of the fundamental wave to a resonance unit 20 in a multiplying oscillator which constructs an oscillator for connecting two negative resistance units 10 to 11 to the resonance unit 20 and generating a signal A and a signal B of mutually opposite phases in the fundamental wave and synthesizes the signal A and the signal B in phase in a synthetic unit 30 and obtains an oscillation signal output.

13 Claims, 13 Drawing Sheets

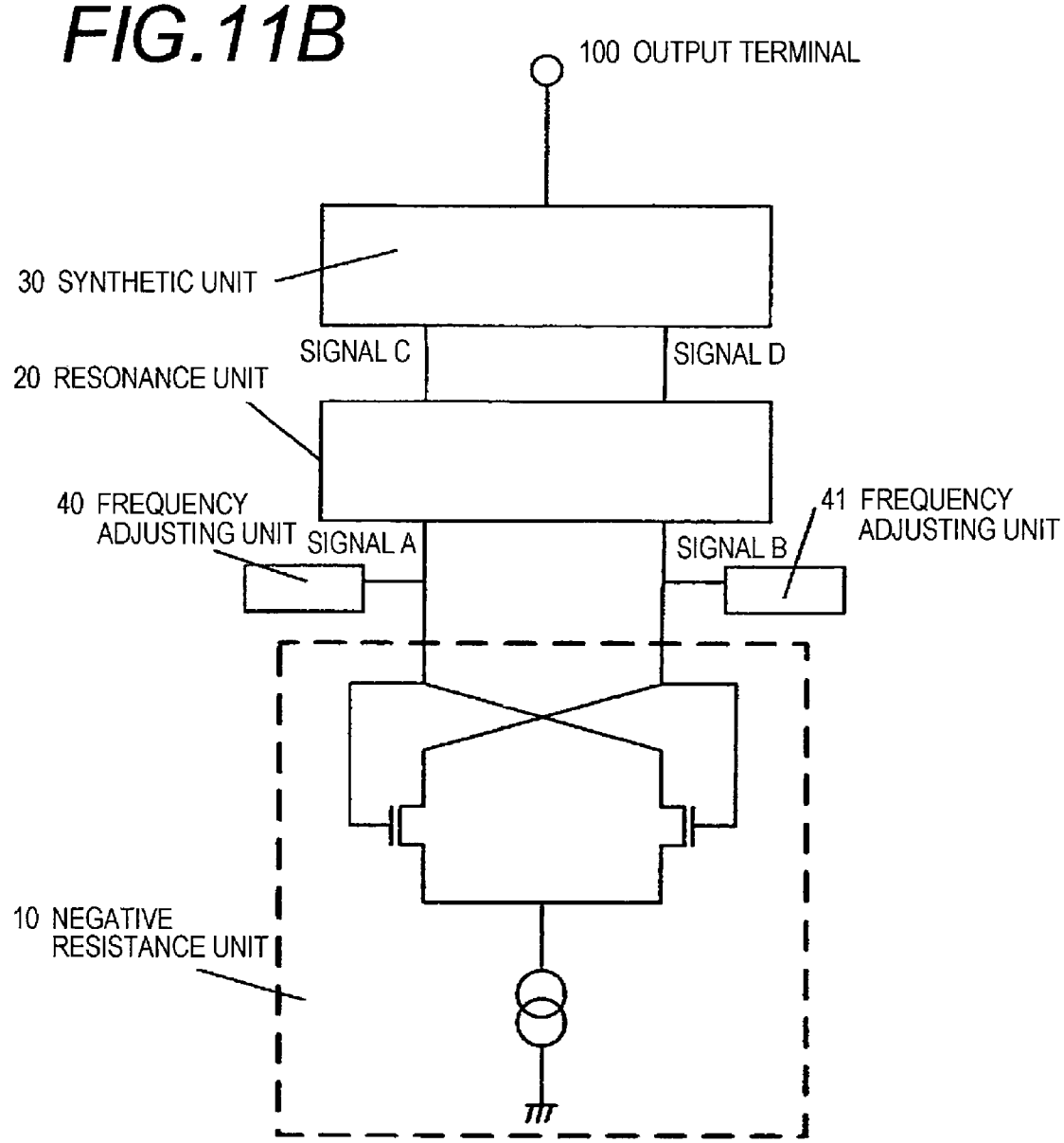

MULTIPLYING OSCILLATOR AND WIRELESS APPARATUS IN WHICH THE SAME IS INSTALLED

TECHNICAL FIELD

The present invention relates to an oscillator for generating a signal with a frequency of a microwave band or more, and particularly to a push-push type multiplying oscillator and a wireless apparatus in which the oscillator is installed.

BACKGROUND ART

A line type resonator of a TEM (Transverse Electromagnetic mode) mode formed on a substrate is commonly used in a high-frequency oscillator for generating a signal with a high frequency of a microwave band or more. Also, a multiplying oscillation configuration known as a push-push oscillator in which the line type resonator of the TEM mode is combined with two negative resistance circuits is used in the high-frequency oscillator. This oscillator includes an oscillator as shown in, for example, Patent Reference 1. A circuit configuration of a conventional push-push oscillator is disclosed in this Reference.

FIG. 9 shows a circuit configuration of a conventional push-push oscillator disclosed in Patent Reference 1. The push-push oscillator shown in FIG. 9 is constructed of a resonator unit 3 and an oscillator unit 4 including two same and symmetrical oscillation units made of a Colpitts oscillator etc. It is constructed so that two outputs from the oscillator unit 4 are mutually inverted 180° in phase and by a synthetic circuit 5 having a transmission line with the same electrical length, fundamental and odd harmonic components are canceled in the output end and only even harmonic components can be doubled and outputted.

Also, in Patent Reference 1, a configuration of being synthesized in opposite phase in a synthetic circuit is shown and a configuration of achieving noise reduction by canceling a noise component inputted from the outside to two oscillation units in phase in the output end is also shown.

Also, there is a multiplying oscillator shown in Patent Reference 2 as a second conventional art. FIG. 10 shows a configuration of a triple-push type oscillator constructed of three oscillation transistors disclosed in Patent Reference 2. In this configuration, a circuit by the three oscillation transistors is constructed so that oscillation signals oscillate mutually in a phase difference of 120° and each output is synthesized by an in-phase synthetic circuit and thereby, threefold harmonics of fundamental waves are multiplied and outputted.

In the conventional multiplying oscillator (Patent Reference 1) described above, outputs oscillated by two oscillators to have a phase difference of 180° are synthesized in phase and thereby, an oscillation signal two times a fundamental frequency can be obtained. Also, in the multiplying oscillator described in Patent Reference 2, outputs oscillated by three oscillators to have a phase difference of 120° are synthesized in phase and thereby, an oscillation signal three times a fundamental frequency can be obtained.
Patent Reference 1: JP-A-4-175001
Patent Reference 2: JP-A-2006-135563

DISCLOSURE OF INVENTION

Problems that the Invention is to Solve

A conventional wireless apparatus generally uses a configuration of oscillating a desired frequency directly by a circuit of a DRO (Dielectric Resonant Oscillator) etc. in which a dielectric Resonator and a transistor operating at a high frequency are combined in the case of generating a local oscillation signal with a high frequency of a microwave band or a millimeter wave band. Also, the conventional wireless apparatus uses a configuration of making frequency conversion of an output of an oscillator oscillating at a low frequency by a multiplier or a configuration of obtaining a signal of a twofold or threefold frequency from a low fundamental oscillation frequency by a push-push multiplying oscillator described in the conventional art.

In the conventional wireless apparatus, it is difficult to adjust the wireless apparatus and power consumption becomes large as compared with an oscillator with a low frequency generally in the case of a configuration of the DRO for directly oscillating a high frequency. Further, the conventional wireless apparatus has a disadvantage that in order to ensure frequency stability, it is necessary to perform temperature management or an electromagnetic shield around an oscillator and a cost increases.

Also, in the conventional wireless apparatus, an operating frequency of a phase comparator is lower than an oscillation frequency even in case of attempting to apply a control system such as a phase lock loop (hereinafter called a PLL) in order to ensure frequency stability. As a result of this, the conventional wireless apparatus has a disadvantage that a fixed frequency dividing circuit called a prescaler is required and circuit scale and power consumption become large.

On the other hand, a configuration of constructing an oscillator at a low frequency at which the PLL operates and making conversion into a desired frequency by a multiplier has advantages that stability by the PLL can be ensured and it is easy to adjust the oscillator and implementing the wireless apparatus can be performed by low power consumption. However, when the number of multiplications is large, spuriousness increases, so that a filter for suppressing this spuriousness must be used and there is also a disadvantage of increasing circuit scale.

On the other hand, in the configuration using the multiplying oscillator described in the background art, a signal of a twofold or threefold high frequency can be obtained while constructing an oscillator at a low frequency at which the PLL operates. As a result of this, the PLL can be used and advantages of decreases in spuriousness or circuit scale by a reduction in the number of multiplications can be obtained and the configuration of solving the various disadvantages described above can be achieved.

However, in the arts described in Patent References 1 and 2 mentioned above, an oscillation output outputted by the multiplying oscillator is about two times to three times that of a fundamental wave, so that it is necessary to add a filter for spurious suppression and a multiplier to the output side when a frequency higher than this oscillation output is required. For example, in the case of using a commercially available IC for PLL operating to 5 GHz, it is necessary to set a fundamental wave of the multiplying oscillator at 5 GHz in a configuration in which a prescaler with high power consumption is not used.

In this case, an output frequency of the multiplying oscillator becomes about 10 to 15 GHz at most and considering application to a local oscillator in a wireless system with a band of 25 GHz or a band of 60 GHz, the need to further multiply the frequency arises. This causes disadvantages of addition of a filter by an increase in spuriousness or an increase in circuit scale by an increase in the number of multiplications in a manner similar to those shown in the previous multiplier configuration.

The invention has been implemented to solve the problems of such conventional arts, and an object of the invention is to provide a multiplying oscillator capable of generating a high frequency signal by small circuit scale and power consumption in an oscillator for generating a signal with a frequency of a microwave band or more, and a wireless apparatus in which the oscillator is installed.

Means for Solving the Problems

A multiplying oscillator according to the invention, includes: a negative resistance unit having negative resistance characteristics; a resonance unit which is connected to the negative resistance unit, and outputs first and second resonance signals of mutually opposite phases in a fundamental wave; a frequency adjusting unit which is connected to the resonance unit, and suppresses first even harmonic of the resonance signal; and a synthetic unit which is connected to the resonance unit, and synthesizes an in-phase component of the first and second resonance signals and cancels an opposite-phase component of the first and second resonance signals to output the synthesized and canceled signals. The synthetic unit cancels odd harmonics and a fundamental wave of the resonance signals and outputs second even harmonic of the resonance signals.

According to the configuration described above, first even harmonic is suppressed by action of a frequency adjusting unit while odd harmonics and a fundamental wave are canceled in a synthetic unit. As a result of this, the multiplying oscillator of the invention mainly outputs a frequency signal of second even harmonic with a frequency higher than that of the first even harmonics as a result, so that a high frequency signal can be generated by small circuit scale and power consumption. Also, there is provided a feature of low phase noise which is a characteristic of a push-push multiplying oscillator. Also, the multiplying oscillator of the invention can fetch a frequency signal higher than a conventional art by fetching the second even harmonic. As a result of this, the multiplying oscillator of the invention can achieve spurious suppression by a decrease in the number of multiplications, and can construct a filter by a less number of stages by moderating required specifications of a filter for local oscillation used in a back stage of an oscillator generally, and can reduce the circuit scale.

Also, in the multiplying oscillator of the invention, the first even harmonic is second harmonic and the second even harmonic is fourth harmonic.

According to the configuration described above, the multiplying oscillator of the invention can suppress a second harmonic component of a fundamental wave outputted normally and fetch a harmonic output of a fourth harmonic or more without increasing circuit scale. Also, the multiplying oscillator of the invention can provide a multiplying oscillator for generating a high frequency signal by small circuit scale and power consumption in an oscillator for generating a signal with a frequency of a microwave band or more.

Also, in the multiplying oscillator of the invention, the frequency adjusting unit may include a first frequency adjusting unit and a second frequency adjusting unit connected to both ends of the resonance unit, respectively, and the first frequency adjusting unit and the second frequency adjusting unit are respectively constructed in series connection of an adjustment inductor and a capacity for resonance and one end of the frequency adjusting unit is connected to the resonance unit and the other end is grounded.

According to the configuration described above, the multiplying oscillator of the invention can suppress first even harmonic by action of a frequency adjusting unit by series connection of an adjustment inductor and a capacity for resonance disposed in both ends of a resonator while odd harmonics and a fundamental wave are canceled in a synthetic unit. As a result of this, the multiplying oscillator of the invention mainly outputs a frequency signal of second even harmonic with a frequency higher than that of the first even harmonic as a result, so that a high frequency signal can be generated by small circuit scale and power consumption. Also, an effect of shortening a resonator length by the capacity for resonance is achieved.

Also, in the multiplying oscillator of the invention, the negative resistance unit may include a first negative resistance unit and a second negative resistance unit which are connected to both ends of the resonance unit, respectively, and have mutually the same configuration.

According to the configuration described above, by connecting negative resistance units to each of both ends of a resonance unit, each of the negative resistance units oscillates in a phase difference of 180° and forms an oscillation output of opposite phase in a fundamental wave, but an even harmonic component is in phase, so that without increasing circuit scale, a second harmonic component of the fundamental wave outputted normally can be suppressed and a harmonic output of a fourth harmonic or more can be fetched, so that circuit integration is facilitated.

Also, in the multiplying oscillator of the invention, the resonance unit may be a line type resonator.

Also, in the multiplying oscillator of the invention, the resonance unit may be a half-wavelength resonator.

According to the configuration described above, an adjustment inductor with a desired small value can be mounted by introducing a line with a thin width as the adjustment inductor.

Also, a multiplying oscillator of the invention includes: a negative resistance unit having negative resistance characteristics; a line type resonator which is connected to the negative resistance unit, and outputs a resonance signal in which a center point becomes a node of a fundamental wave; and a frequency adjusting unit which is connected to the line type resonator, and suppresses first even harmonic of the resonance signal. Second even harmonic of the resonance signal is outputted from the center point of the line type resonator.

According to the configuration described above, in an oscillation state of the multiplying oscillator, signals of both ends of a line type resonator vibrate in a phase difference of 180° mutually at an oscillation frequency of fundamental waves and a center point becomes a node and an output level cannot be obtained in the center point. Also, for odd harmonics, it similarly becomes a node and an output is not produced. On the other hand, for even harmonics, the center point becomes an antinode and a large output level can be obtained in the center point, but first even harmonic are suppressed by first and second frequency adjusting units, so that second even harmonic with a frequency higher than the first even harmonic can be fetched. As a result, the second even harmonic can be obtained as an oscillation output without using a synthetic unit and the multiplying oscillator can be constructed compactly.

Also, the invention includes a negative resistance unit having negative resistance characteristics; a resonance unit which is connected to the negative resistance unit, and outputs a first resonance signal and a second resonance signal of mutually opposite phases in a fundamental wave; a frequency adjusting unit which is connected to the resonance unit, and suppresses first even harmonic of the resonance signals; and a synthetic unit which is connected to the negative resistance unit, and synthesizes an in-phase component of the first resonance signal and the second resonance signal and cancels an opposite-phase component of the first resonance signal and the second resonance signal to output the synthesized and canceled signals. The synthetic unit cancels odd harmonics and a fundamental wave of the resonance signals and outputs second even harmonic of the resonance signals.

According to the configuration described above, the multiplying oscillator of the invention can suppress first even harmonic by action of a frequency adjusting unit disposed in a resonance unit while odd harmonics and a fundamental wave are canceled by a configuration of connecting a synthetic unit to a negative resistance unit. As a result of this, the multiplying oscillator of the invention can construct the multiplying oscillator for generating a frequency signal of second even harmonic with a frequency higher than that of the first even harmonic as a result, and the synthetic unit can be arranged in consideration of ease etc. of layout at the time of mounting.

Also, in the multiplying oscillator of the invention, the frequency adjusting unit is constructed in series connection of an adjustment inductor and a capacity for resonance and is connected between both ends of the resonance unit.

According to the configuration described above, the multiplying oscillator of the invention can have a circuit configuration insusceptible to a ground by a configuration of disposing a frequency adjusting unit between both ends of a resonance unit. Also, the multiplying oscillator of the invention can suppress first a twofold harmonic level by action of the frequency adjusting unit disposed in the resonance unit while odd harmonics and a fundamental wave are suppressed. As a result, the multiplying oscillator of the invention can construct the multiplying oscillator for generating a frequency signal of even harmonics four times the fundamental wave.

Also, in the multiplying oscillator of the invention, the negative resistance unit is constructed of a differential pair in which emitter or source terminals of two transistors are connected.

According to the configuration described above, a negative resistance component is generated between two drain terminals of a cross feedback type circuit by applying a proper bias to a transistor, and an operation as an oscillator is performed by connecting a resonance unit between the terminals. A differential type negative resistance circuit configuration using pair transistors insusceptible to a ground is effective in the case of forming a circuit on a substrate difficult to enhance the ground, for example, an integrated circuit on a silicon substrate.

Also, in the multiplying oscillator of the invention, the capacity for resonance is a variable capacity diode in which an oscillation frequency is changed by a control voltage.

According to the configuration described above, it can be constructed as a voltage control oscillator in which an oscillation frequency changes by a voltage by constructing a capacity for resonance of a variable capacity diode.

Also, in the multiplying oscillator of the invention, a fundamental component of the resonance signal is outputted as a signal for phase lock circuit.

According to the configuration described above, the multiplying oscillator of the invention can construct a local oscillator by a frequency synthesizer configuration by combination with a phase lock circuit capable of controlling a frequency by an electrical signal. As a result of this, the multiplying oscillator of the invention can construct the multiplying oscillator stably and adjustably by the phase lock circuit.

Also, in the multiplying oscillator of the invention, fundamental components of the first resonance signal and the second resonance signal are outputted as a differential signal for phase lock circuit.

According to the configuration described above, a phase lock circuit with high stability can be constructed by setting fundamental components of a first resonance signal and a second resonance signal as a differential signal for phase lock circuit.

Also, a wireless apparatus of the invention is a wireless apparatus in which the multiplying oscillator as described above and a local oscillator including a phase lock circuit are installed, wherein the multiplying oscillator supplies a fundamental component of the resonance signal to the phase lock circuit, and wherein the phase lock circuit supplies a control signal for changing a capacity of the variable capacity diode to the multiplying oscillator, and operates at a fundamental frequency of the resonance signal.

According to the configuration described above, the wireless apparatus of the invention can operate a phase lock circuit at a frequency lower than ever before in the case of attempting to obtain a local oscillation signal with a high frequency. As a result of this, in the wireless apparatus of the invention, it is unnecessary to use a prescaler in which power consumption increases generally, and circuit scale and power consumption can be reduced. Particularly, the wireless apparatus used in a wireless system using a frequency band of 20 GHz band or more can be miniaturized with low power consumption and it is useful.

Also, the wireless apparatus of the invention includes a multiplier for multiplying a frequency of an output signal of the multiplying oscillator by an integer of two or more.

According to the configuration described above, in the wireless apparatus of the invention, a multiplying oscillator can output, for example, a frequency four times a fundamental wave using an operating frequency of a phase lock circuit as the fundamental wave. As a result of this, the wireless apparatus of the invention can halve the number of multiplications of a multiplying circuit as compared with a conventional push-push oscillator for outputting a second harmonic, and can reduce circuit scale and power consumption accordingly. Therefore, when an oscillator of the invention is integrated, a chip area can be decreased by effects of a reduction in a filter or a reduction in circuit scale, so that the wireless apparatus can be implemented at low cost.

Advantage of Invention

According to the invention, a multiplying oscillator capable of generating a high frequency signal by small circuit scale and power consumption in an oscillator for generating a signal with a frequency of a microwave band or more can be provided. Concretely, a multiplying oscillator capable of suppressing a second harmonic component of a fundamental wave outputted normally and fetching a harmonic output of a fourth harmonic or more without increasing circuit scale in a push-push multiplying oscillator configuration can be obtained.

BRIEF DESCRIPTION OF DRAWINGS

FIG. 11B is a block diagram showing another configuration of the multiplying oscillator according to the sixth embodiment.

Figure 1:
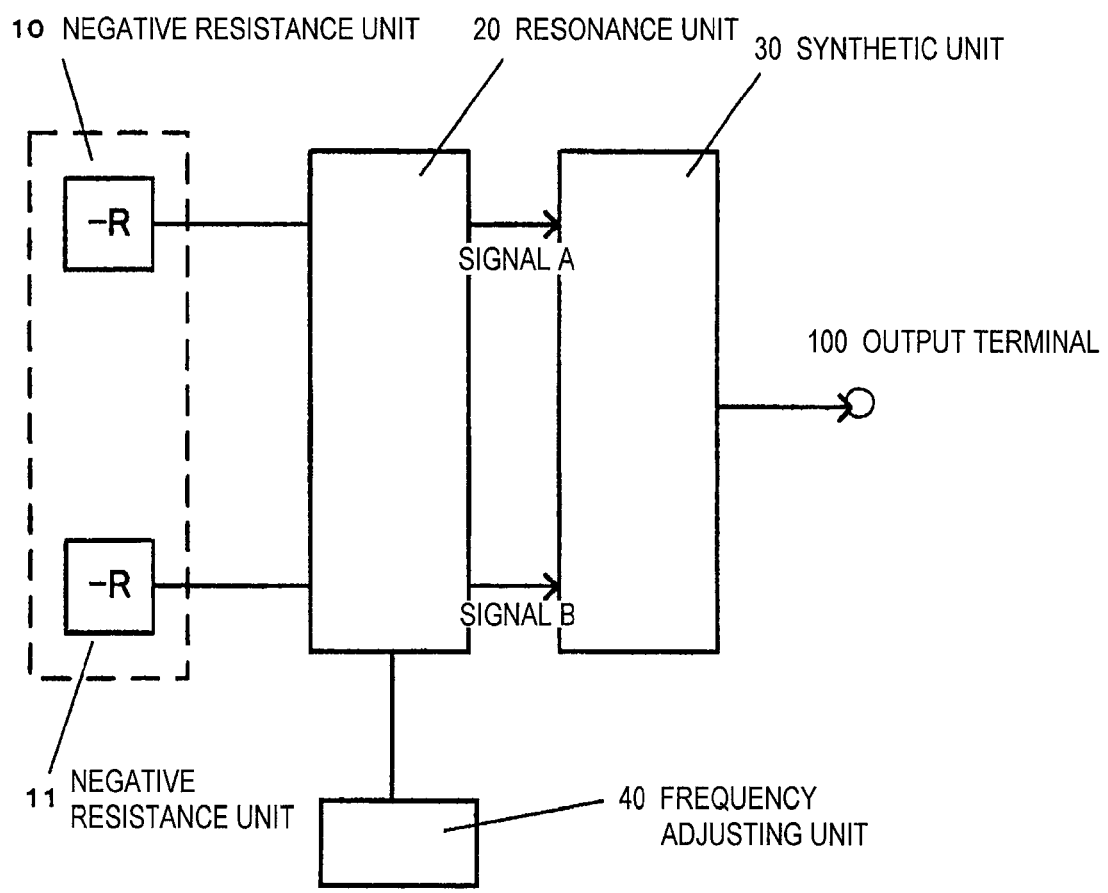
FIG. 1 is a block diagram showing a configuration of a multiplying oscillator according to a first embodiment.

DESCRIPTION OF REFERENCE NUMERALS AND SIGNS 10,11 NEGATIVE RESISTANCE UNIT
20 RESONANCE UNIT
30 SYNTHETIC UNIT
40,41,42 FREQUENCY ADJUSTING UNIT
51,52 CAPACITY FOR RESONANCE
61,62 ADJUSTMENT INDUCTOR
80 MULTIPLYING OSCILLATOR
100,110 OUTPUT TERMINAL
200 PHASE LOCK CIRCUIT
300 MULTIPLYING CIRCUIT

BEST MODE FOR CARRYING OUT THE INVENTION

Embodiments of a multiplying oscillator of the invention will hereinafter be described. In addition, in the following embodiments, the same numerals are assigned to the same configurations and its explanation is omitted since the explanation overlaps.

First Embodiment

FIG. 1 is a block diagram showing a configuration of a multiplying oscillator according to a first embodiment of the invention. As shown in FIG. 1, the multiplying oscillator according to the first embodiment includes negative resistance units 10 to 11, a resonance unit 20, a synthetic unit 30, a frequency adjusting unit 40 and an output terminal 100.

The negative resistance units 10 to 11 are circuits for generating negative resistance for compensating for energy loss of a resonator or a used element in an oscillator, that is, circuits having negative resistance characteristics, and are constructed using a bipolar or FET transistor. The negative resistance units 10 and 11 have the same configuration and the same bias condition. Since a publicly known circuit configuration of a Colpitts type or a Hartley type is generally used as a concrete circuit configuration, the detailed explanation is omitted.

The resonance unit 20 is connected to the negative resistance units 10 to 11, and a resonance frequency of the resonance unit 20 is adjusted so that a fundamental oscillation frequency becomes a desired value. Generally, a line type resonator of a TEM mode is commonly used in the resonance unit 20 and a resonance frequency changes by a line length of the resonator, so that an oscillation frequency is adjusted by the line length.

A length of the resonator 20 is adjusted so that an electrical length in a resonance frequency becomes a half wavelength generally, and a core portion of a push-push multiplying oscillator is constructed by connecting the negative resistance units 10 and 11 to both ends of this line resonator. In this case, the negative resistance units 10 and 11 oscillate in a phase difference of 180° and a signal A and a signal B of FIG. 1 fetched from both ends of the resonator become oscillation outputs of opposite phases in fundamental waves.

The synthetic unit 30 is connected to the resonance unit 20 and synthesizes the signal A and the signal B of mutually opposite phases fetched from the resonance unit 20 in phase and outputting the signals to the output terminal 100. In fundamental waves, a phase difference between the signal A and the signal B is 180° and the signals are canceled by synthesis, so that a fundamental component does not appear in the output terminal 100.

On the other hand, even harmonic components in the signal A and the signal B are in phase, so that the components are enhanced and appear in the output terminal 100 of the synthetic unit 30. The synthetic unit 30 is mounted by a configuration of making connection through a line having the same length or a configuration of a Wilkinson type electric power synthetic unit.

The frequency adjusting unit 40 is connected to the resonance unit 20 and has action of changing output levels of harmonics and a fundamental wave outputted by an oscillator. The frequency adjusting unit 40 is mounted by a circuit with low impedance at a frequency two times the fundamental wave, and has action of suppressing the output levels of twofold harmonics in the output terminal 100.

At the same time, adjustment is made so as not to become low impedance with respect to fourfold even harmonics and in low-order harmonics, a higher output level is generally obtained, so that as a result, a frequency signal four times the fundamental wave is outputted to the output terminal 100 at the highest level.

According to the first embodiment as described above, the multiplying oscillator can suppress odd harmonics and a fundamental wave in the output terminal 100. Further, the multiplying oscillator can suppress a twofold harmonic level by action of the frequency adjusting unit 40. As a result, the first embodiment can obtain the multiplying oscillator for generating a frequency signal of even harmonics four times the fundamental wave.

Therefore, the need for a doubling circuit of a second harmonic or a quadrupling circuit of a fundamental wave conventionally used in order to obtain a frequency signal of a fourth harmonic is eliminated and an oscillator with small circuit scale and power consumption can be implemented. Also, there is provided a feature of low phase noise which is a characteristic of a push-push multiplying oscillator.

Second Embodiment

Figure 2:
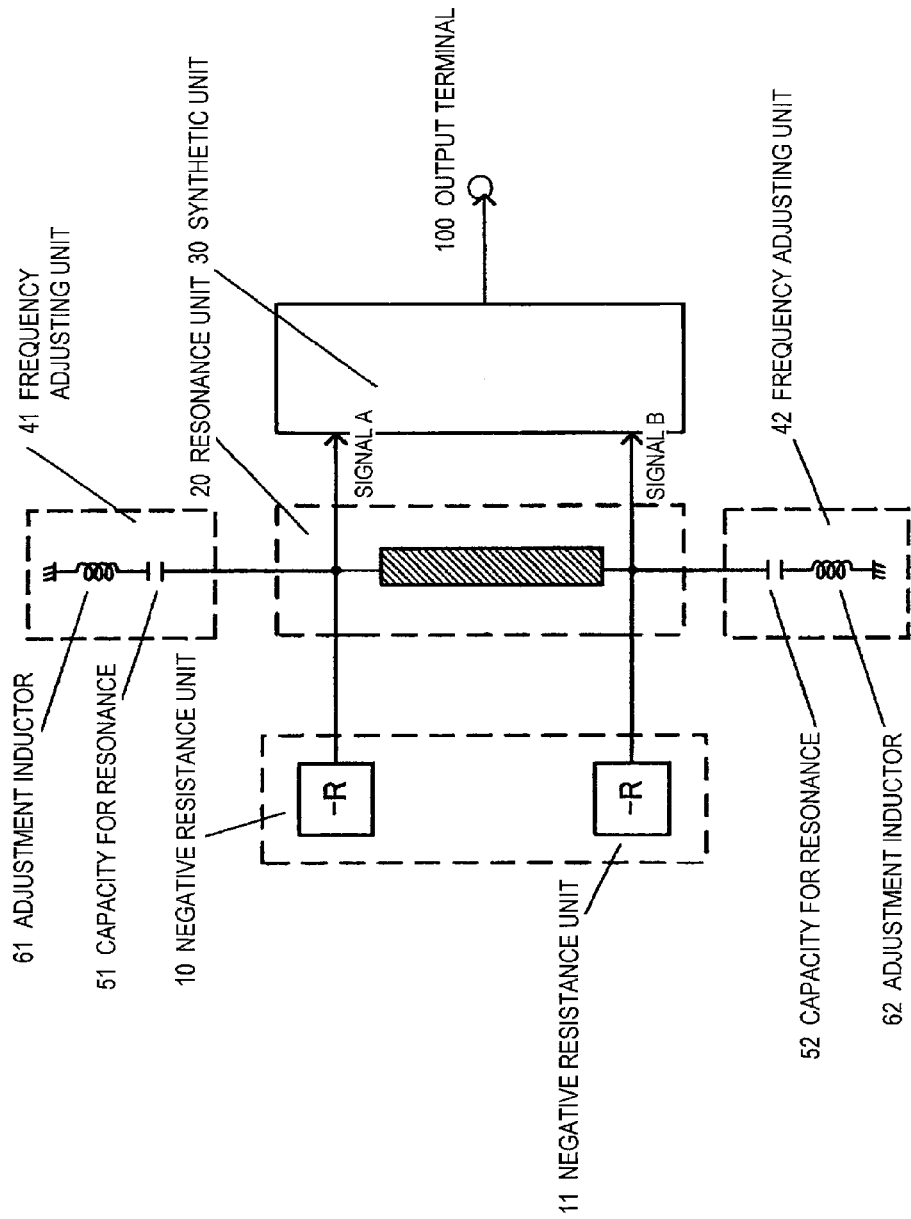
FIG. 2 is a block diagram showing a configuration of a multiplying oscillator according to a second embodiment.

FIG. 2 is a block diagram showing a configuration of a multiplying oscillator according to a second embodiment of the invention. The multiplying oscillator according to the second embodiment shown in FIG. 2 includes two frequency adjusting units in the configuration of FIG. 1.

A resonance unit 20 is a line type half-wavelength resonator resonating on fundamental waves, and both ends are respectively connected to negative resistance units 10 and 11 and also are connected to frequency adjusting units 41 and 42.

The frequency adjusting unit 41 is constructed in series connection of an adjustment inductor 61 and a capacity 51 for resonance, and one end is connected to the resonance unit 20 and the other end is grounded. Similarly, the frequency adjusting unit 42 is constructed in series connection of an adjustment inductor 62 and a capacity 52 for resonance, and one end is connected to the resonance unit 20 and the other end is grounded.

The capacities 51 and 52 for resonance have the same capacity value, and have an effect of shortening a resonator length of the resonance unit 20 while an oscillation frequency is adjusted by the capacity value. Also, it can be constructed as a voltage control oscillator in which an oscillation frequency changes depending on a voltage by using variable capacity diodes in the capacities 51 and 52 for resonance.

The adjustment inductors 61 and 62 have the same inductor value, and have a function, which is a function of the frequency adjusting units 41 and 42, of suppressing and adjusting a level of second harmonic.

Figure 3:
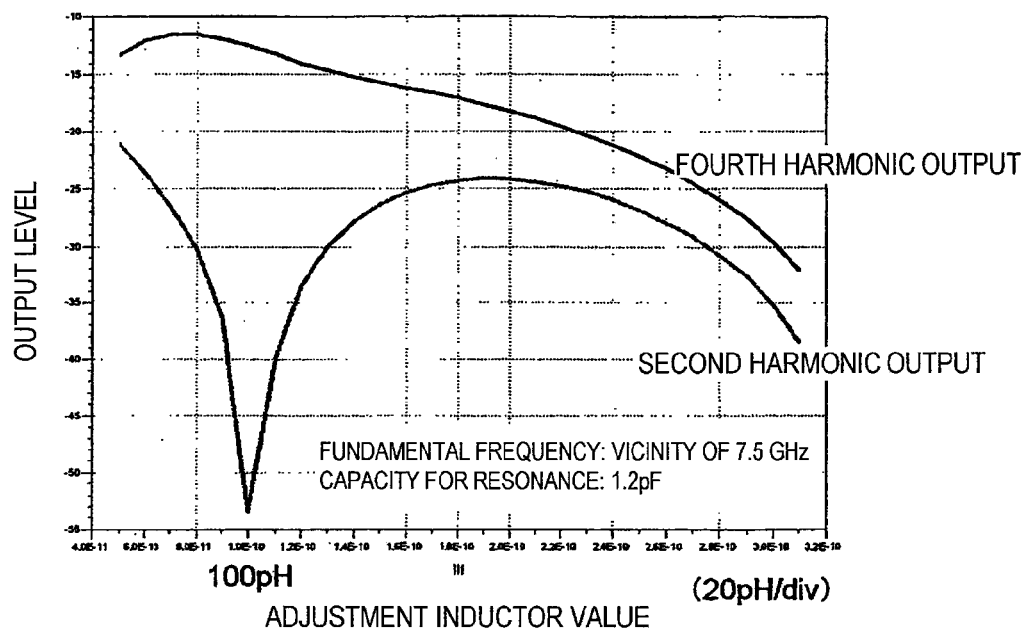
FIG. 3 is a diagram showing one example of a relation between an oscillation output level and an inductor value of an adjustment inductor in the multiplying oscillator according to the second embodiment.

FIG. 3 shows one example of changes in output levels of a second harmonic and a fourth harmonic in the output end by a value of the adjustment inductor. The output levels of the second harmonic and the fourth harmonic in the case of changing an adjustment inductor value from about 50 pH to 310 pH under condition that a fundamental frequency is about 7.5 GHz and a capacity value for resonance is set at 1.2 pF and a resonator length is shortened than a half wavelength are shown.

Particularly, in the case of setting an inductor value in the vicinity of 100 pH, with respect to 15 GHz which is a second harmonic, impedance of the frequency adjusting unit becomes low and only a second harmonic level is suppressed. When an adjustment inductor value is in the vicinity of 80 pH, a fourth harmonic level becomes high, so that an output spectrum of an oscillator of the present embodiment of the case of being set at this value is shown in FIG. 4.

Figure 4:
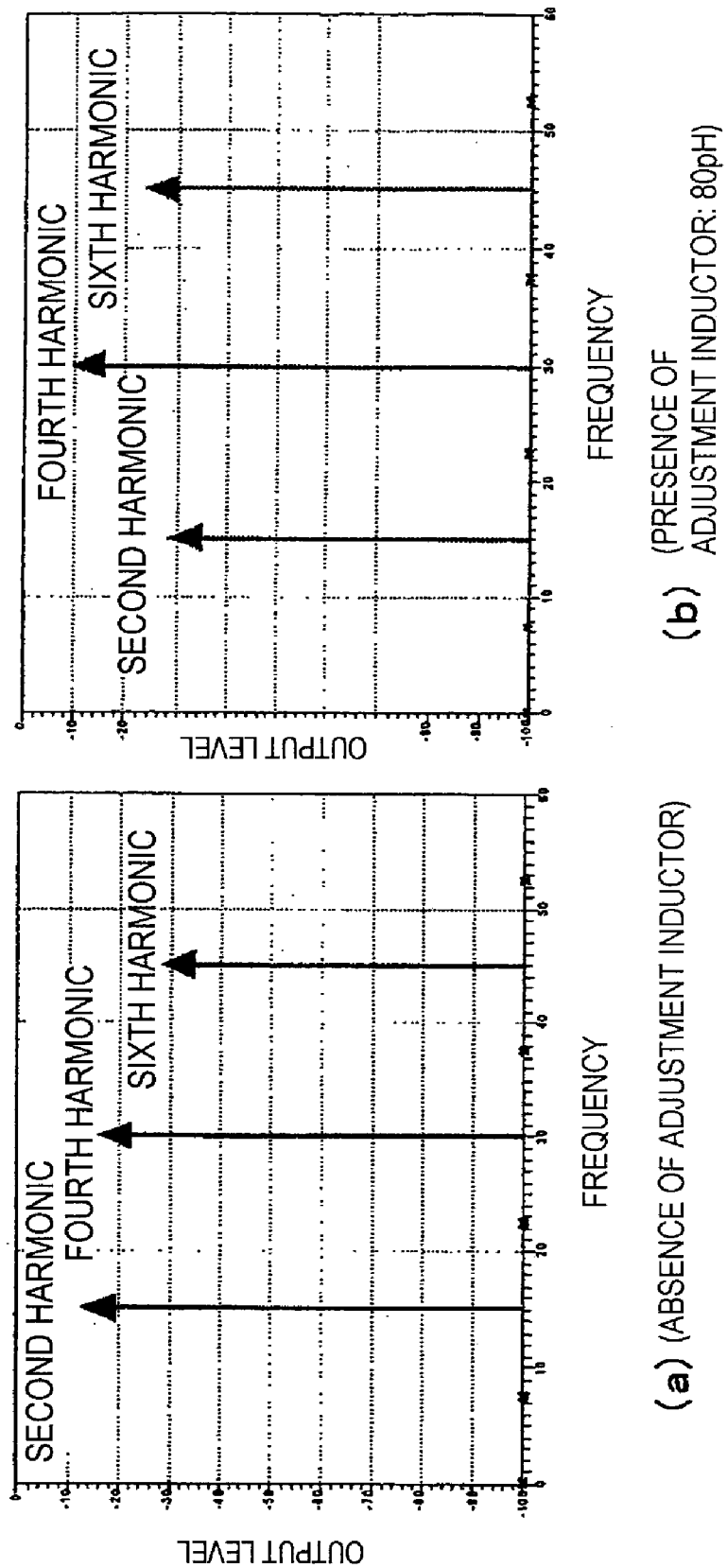
FIG. 4 is a diagram showing one example of a spectrum by the presence or absence of the adjustment inductor in the multiplying oscillator according to the second embodiment.

In FIG. 4, (a) shows a spectrum of the case of only a capacity for resonance (configuration of excluding the adjustment inductors 61, 62 from the configuration of FIG. 2) and (b) shows a spectrum of the case of adding an adjustment inductor of 80 pH to a capacity for resonance (configuration of FIG. 2), respectively. In a push-push multiplying oscillator of a conventional configuration or a configuration of adding a capacity for resonance to its resonator, as shown in (a) of FIG. 4, a fundamental wave and odd harmonics are suppressed by cancel action and an oscillation signal of even harmonics is outputted and its level becomes high with low-order harmonics. On the other hand, in the multiplying oscillator of the present embodiment, an oscillation signal in which a second harmonic level is suppressed and a fourth harmonic level is enhanced by action of the frequency adjusting unit using the adjustment inductor is outputted.

Figure 5:
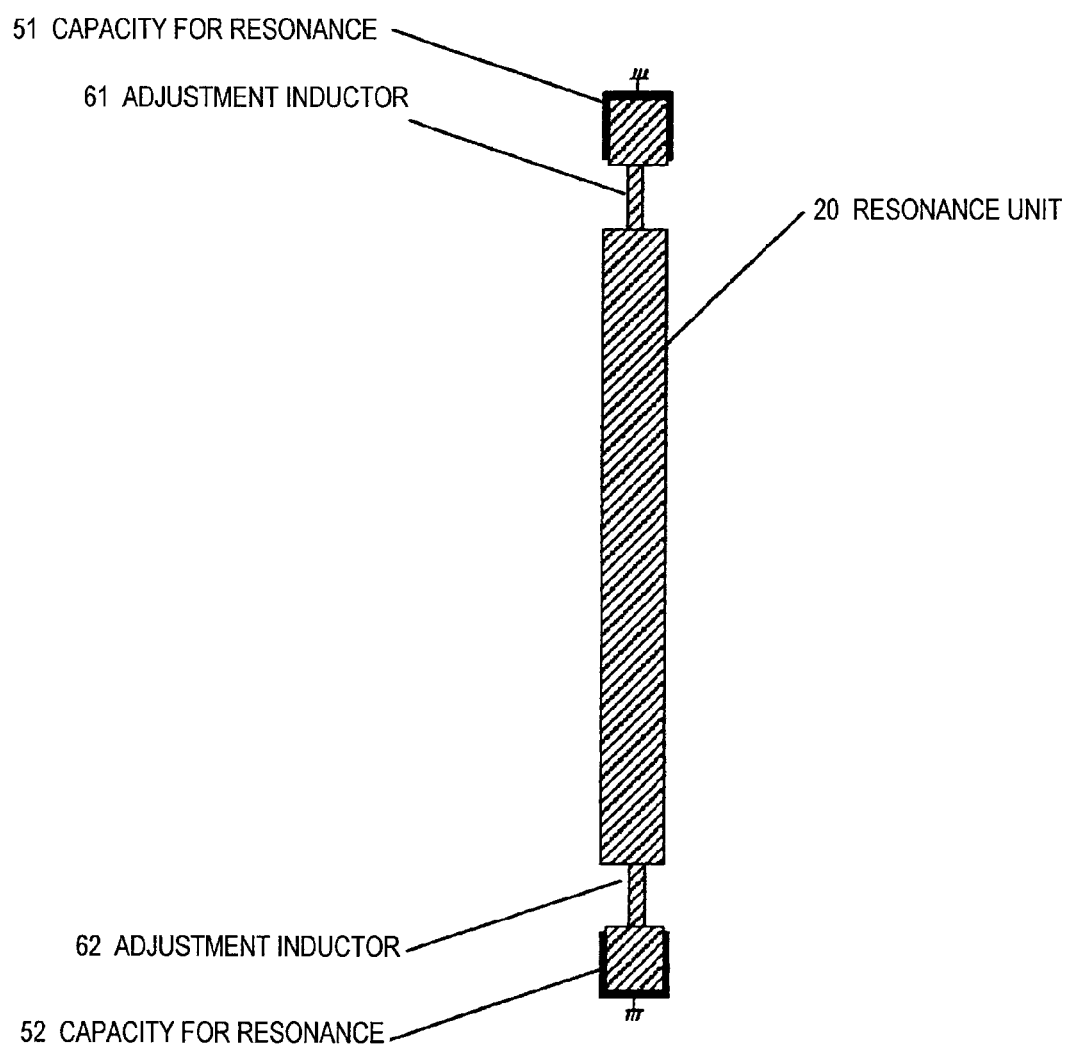
FIG. 5 is a diagram showing a mounting example of a frequency adjusting unit in the multiplying oscillator according to the second embodiment.

FIG. 5 shows one example of realization of the frequency adjusting unit. FIG. 5 illustrates only the frequency adjusting unit and the resonance unit of the multiplying oscillator of the present embodiment. The resonance unit 20 is a line type half-wavelength resonator, and the frequency adjusting units (41(42) of FIG. 2) made of series connection of the adjustment inductors 61(62) and the capacities 51(52) for resonance are connected to both ends of the resonance unit 20 (half-wavelength resonator).

The capacities 51 and 52 for resonance have action of shortening a resonator length of the resonance unit 20. The capacities 51 and 52 for resonance are formed by an MIM capacitor structure etc. on MMIC (Monolithic Microwave Integrated Circuits) or a chip capacitor mounted on PCB (Poly Chlorinated Biphenyl). An image of an MIM capacitor is illustrated in FIG. 5.

The adjustment inductors 61 and 62 have action of suppressing a second harmonic output. The adjustment inductors 61 and 62 add a capacity for resonance with a size of the extent of obtaining an effect of shortening the resonator length. As a result of this, inductor values of the adjustment inductors 61 and 62 may become a small value of the extent to which the value is not provided in a chip component. In such a case, the adjustment inductor with a desired small value can be mounted by introducing a line with a thin width as shown in FIG. 5.

According to the second embodiment as described above, the multiplying oscillator can suppress odd harmonics and a fundamental wave in an output terminal 100. Further, the multiplying oscillator can suppress a twofold harmonic level by action of the frequency adjusting units by series connection of the adjustment inductors and the capacities for resonance disposed in both ends of the resonator. As a result, the second embodiment can obtain the multiplying oscillator for generating a frequency signal of even harmonics four times the fundamental wave.

Third Embodiment

Figure 6:
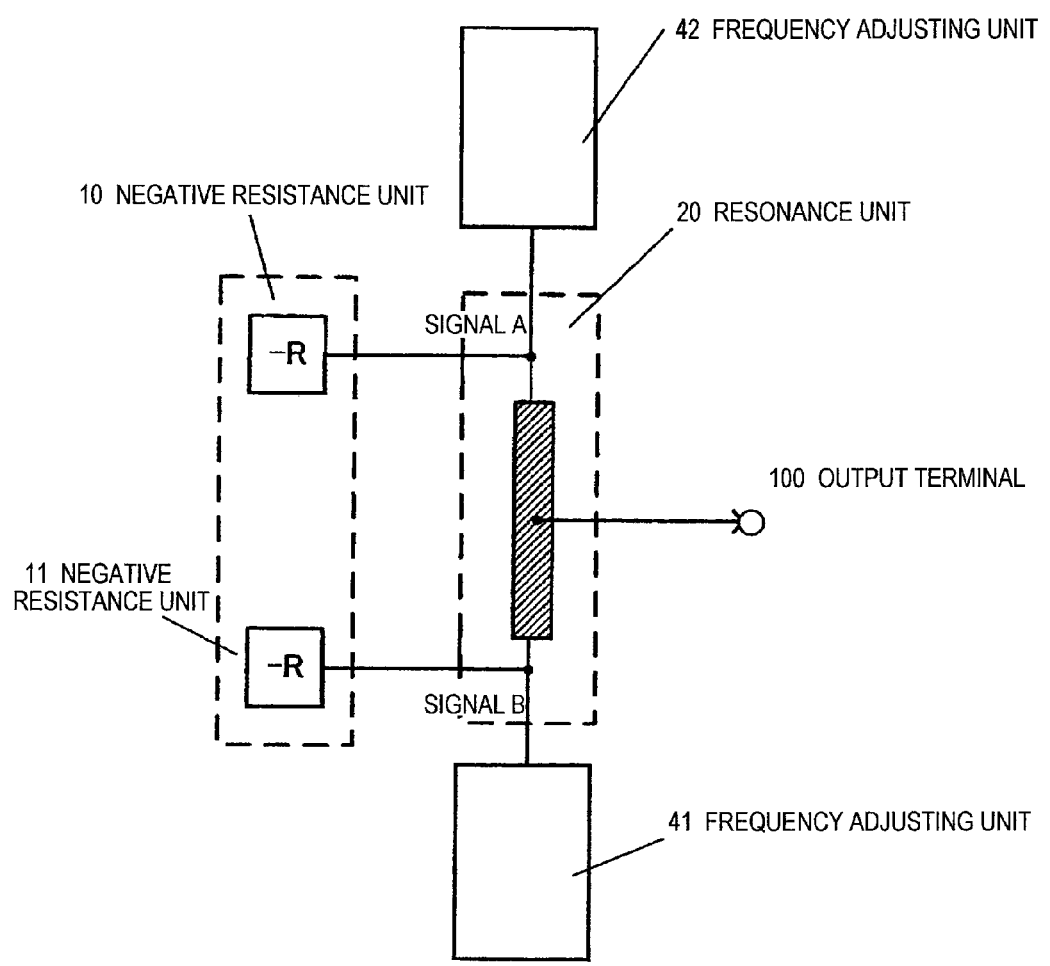
FIG. 6 is a block diagram showing a configuration of a multiplying oscillator according to a third embodiment.

FIG. 6 is a block diagram showing a configuration of a multiplying oscillator according to a third embodiment of the invention. The multiplying oscillator according to the third embodiment shown in FIG. 6 is configured to include two frequency adjusting units in the configuration of FIG. 1 and also exclude the synthetic unit 30 and make series connection between a resonance unit 20 and an output terminal 100.

The resonance unit 20 is a line type half-wavelength resonator resonating on fundamental waves, and both ends are respectively connected to negative resistance units 10 and 11 and also are connected to frequency adjusting units 41 and 42. The output terminal 100 is connected to a center point of the half-wavelength resonator.

In an oscillation state of the present multiplying oscillator, a signal A and a signal B of both ends of the half-wavelength resonator vibrate in a phase difference of 180° at an oscillation frequency of fundamental waves and the center point becomes a node and an output level cannot be obtained in the center point. Similarly for odd harmonics, it becomes a node and an output is not produced.

On the other hand, for even harmonics, the center point becomes an antinode and a large output level enhanced can be obtained in the center point. As a result, the even harmonics can be obtained as an oscillation output without using the synthetic unit.

According to the third embodiment as described above, the multiplying oscillator can suppress odd harmonics and a fundamental wave by a configuration of connecting the output terminal 100 to the center point of the half-wavelength resonator of the resonance unit 20. Further, the multiplying oscillator can suppress a twofold harmonic level by action of the frequency adjusting units disposed in both ends of the resonator. As a result, the third embodiment can compactly construct the multiplying oscillator for generating a frequency signal of even harmonics four times the fundamental wave without using the synthetic unit.

Fourth Embodiment

Figure 7:
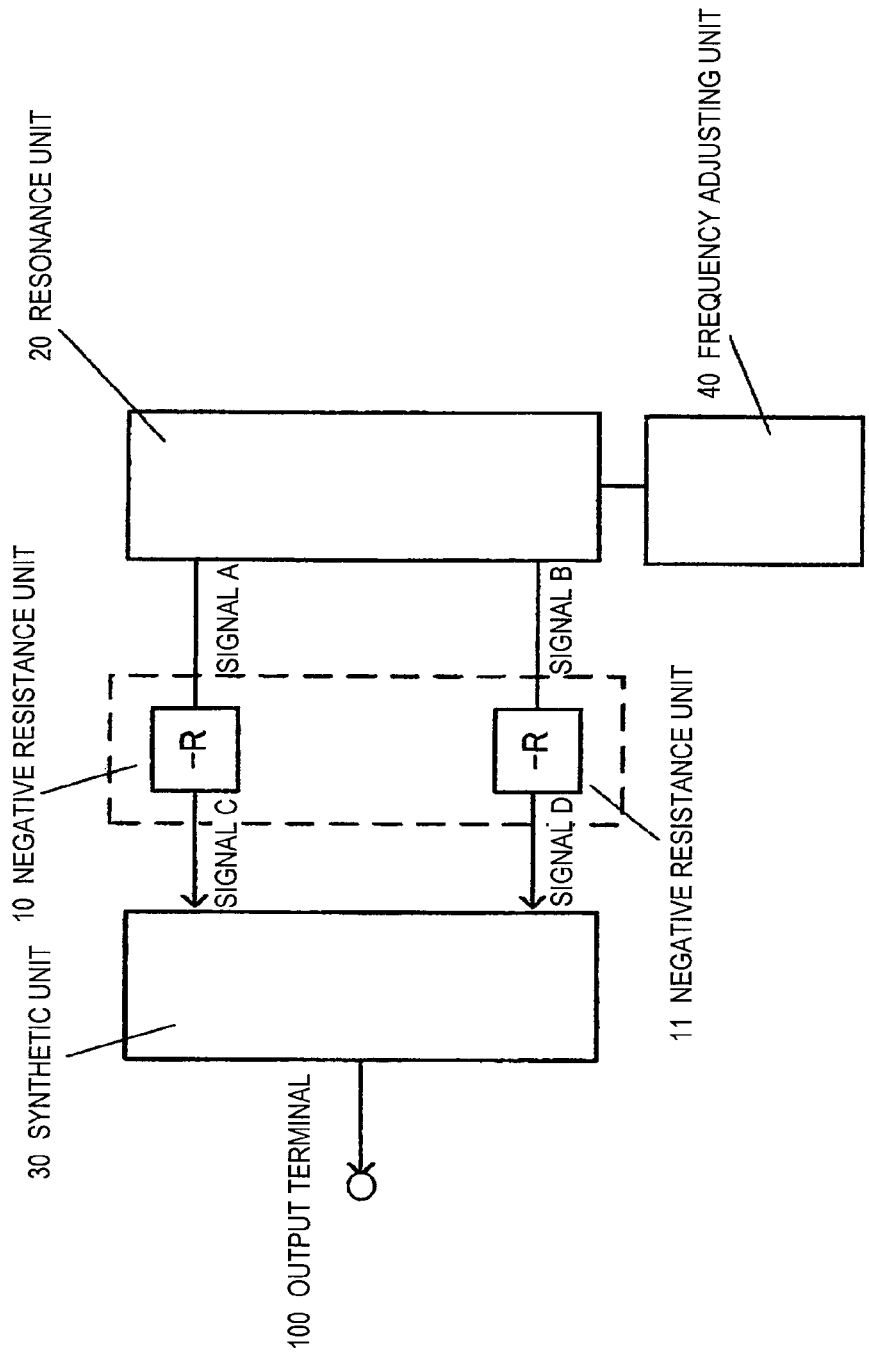
FIG. 7 is a block diagram showing a configuration of a multiplying oscillator according to a fourth embodiment.

FIG. 7 is a block diagram showing a configuration of a multiplying oscillator according to a fourth embodiment of the invention. The multiplying oscillator according to the fourth embodiment shown in FIG. 7 is configured to connect a synthetic unit 30 in the configuration of FIG. 1 to negative resistance units 10 and 11 rather than a resonance unit 20.

The negative resistance units 10 and 11 are connected to the resonance unit 20 and are also connected to the synthetic unit 30. The negative resistance units 10 and 11 are constructed by a circuit of the same configuration, and oscillation signals fetched from the same places of the circuits of the negative resistance units 10 and 11 have an opposite-phase relation of a phase difference of 180° in fundamental waves.

Therefore, an effect similar to that of the first embodiment can also be obtained by a configuration in which a signal C and a signal D are obtained by being fetched from the same places different from places connected to the resonance unit 20 in the circuits of the negative resistance units 10 and 11 and the signal C and the signal D are synthesized in phase by the synthetic unit 30. Therefore, the synthetic unit can be arranged as shown in FIG. 7 in consideration of ease etc. of layout at the time of mounting.

According to the fourth embodiment as described above, the multiplying oscillator can also suppress odd harmonics and a fundamental wave by a configuration of connecting the synthetic unit 30 to the negative resistance units 10 and 11. Further, the multiplying oscillator can suppress a twofold harmonic level by action of a frequency adjusting unit disposed in the resonance unit. As a result, the fourth embodiment can construct the multiplying oscillator for generating a frequency signal of even harmonics four times the fundamental wave.

Fifth Embodiment

Figure 8:
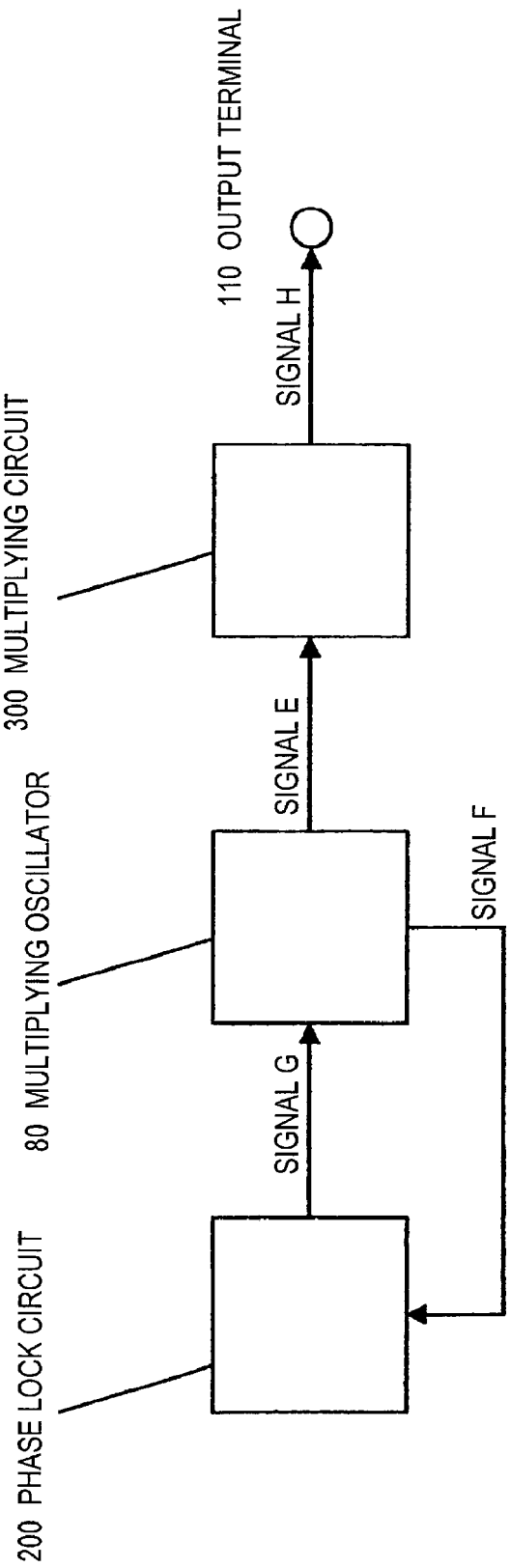
FIG. 8 is a block diagram showing a configuration of a multiplying oscillator according to a fifth embodiment.
Figure 9:
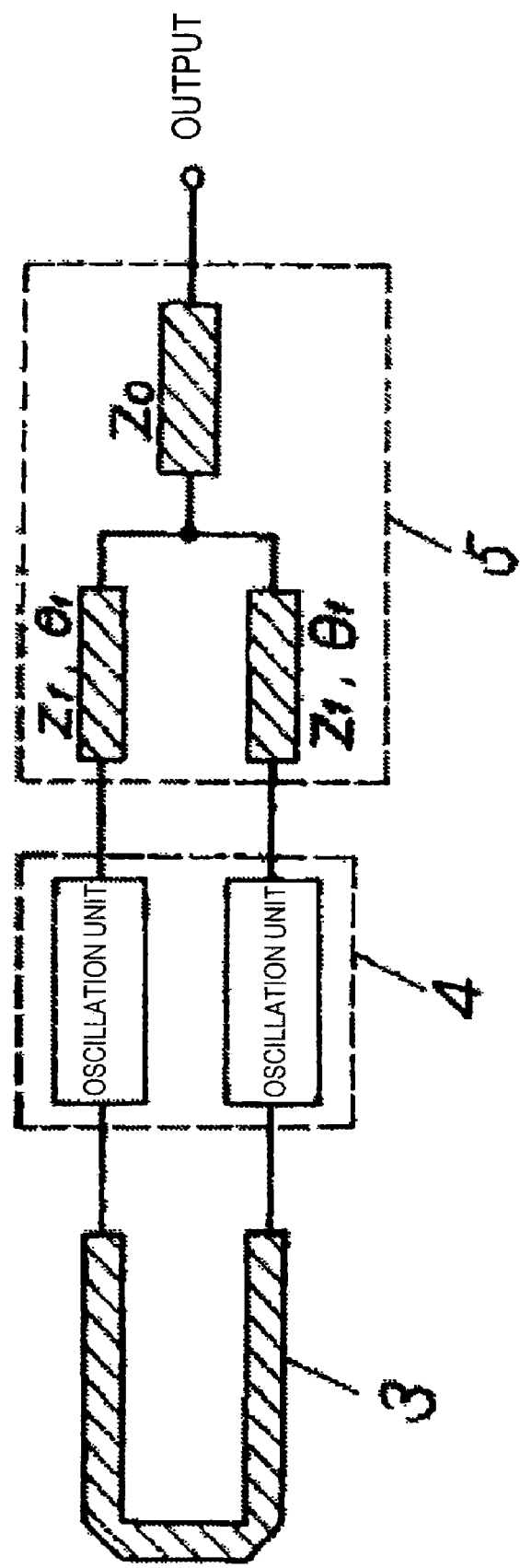
FIG. 9 is shows a configuration of a conventional multiplying oscillator (1).
Figure 10:
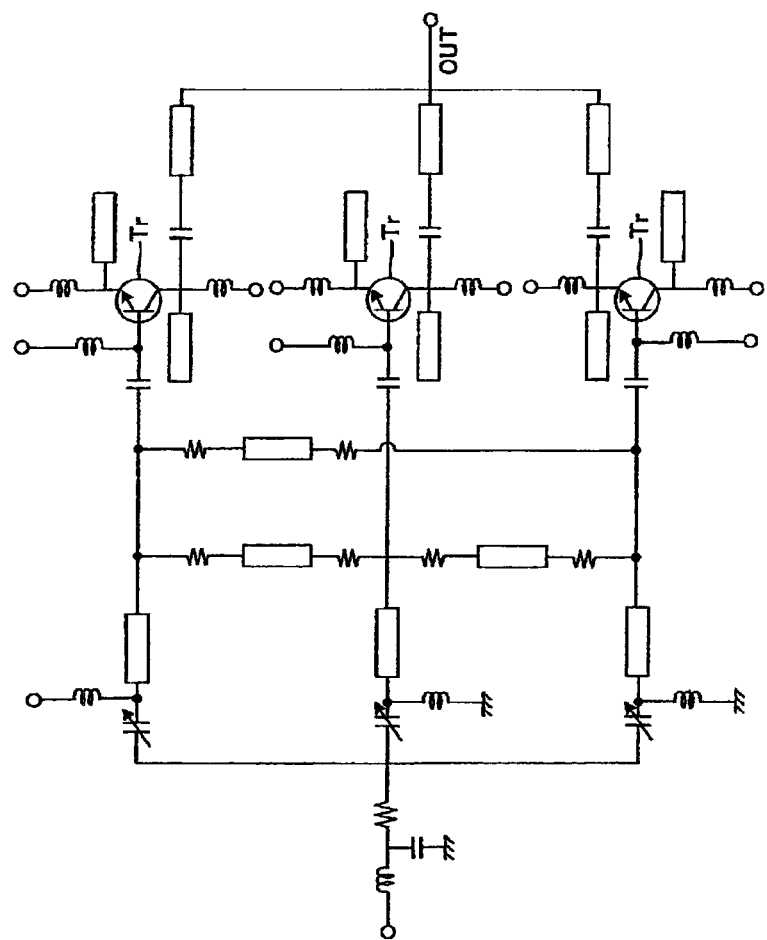
FIG. 10 is shows a configuration of a conventional multiplying oscillator (2).

FIG. 8 is a block diagram showing a configuration of a local oscillator according to a fifth embodiment of the invention. The local oscillator according to the fifth embodiment shown in FIG. 8 is configured to connect a phase lock circuit 200 and a multiplying circuit 300 to a multiplying oscillator 80 of the invention and connect an output terminal 110 to the multiplying circuit 300.

The multiplying oscillator 80 is the multiplying oscillator described in the first to fourth embodiments, and outputs a frequency signal four times a fundamental wave as a signal E as an oscillation output.

Also, the multiplying oscillator 80 is constructed so as to form a voltage control oscillator in which an oscillation frequency changes by an inputted signal G. This is constructed by adding a variable reactance element to the inside of the multiplying oscillator 80. For example, it can be constructed by connecting a variable capacity diode to the inside of the multiplying oscillator 80 and changing a bias of the variable capacity diode by the signal G.

In this case, it can be implemented by, for example, replacing the capacity 51 or 52 for resonance shown in FIG. 2 with a variable capacity diode as a connection place of the variable capacity diode. Also, it may be implemented by a configuration of, for example, adding and disposing a variable capacity diode in parallel with the capacity for resonance. Of course, a voltage control oscillator may be implemented by adding a variable capacity diode to a negative resistance unit or a resonance unit and disposing the variable capacity diode.

Also, the multiplying oscillator 80 is constructed so as to output a signal F of a fundamental frequency. Since an output level of a fundamental wave cannot be obtained from the output terminal 100 in the first to fourth embodiments, a signal before being synthesized by a synthetic unit is extracted and is set at a signal F.

For example, the signal can be set at the signal F by a configuration of extracting the signal A or the signal B in FIG. 2. Also, the signal can be set at the signal F by a configuration of extracting the signal C or the signal D in FIG. 7. Also, the signal can be set at a differential fundamental signal F by extracting both of the signal A and the signal B or can be set at the differential fundamental signal F by extracting both of the signal C and the signal D.

The phase lock circuit 200 has a configuration including the portion other than an oscillator among units constructing a PLL, and includes elements constructing the general PLL, for example, a reference oscillation source, a phase comparator, a frequency divider, a charge pump and a loop filter. The phase lock circuit 200 outputs the signal G for controlling an oscillation frequency of the multiplying oscillator 80. A PLL by a loop configuration of the multiplying oscillator 80 and the phase lock circuit 200 operates at a fundamental frequency. A frequency synthesizer can also be constructed by varying a frequency divider of the inside of the phase lock circuit 200.

The multiplying circuit 300 is a circuit for further converting a frequency signal E four times a fundamental wave outputted by the multiplying oscillator 80 into a twofold or more frequency. The multiplying circuit 300 generates a frequency signal H an integral multiple (two times or more) of a frequency of the signal E and outputs the frequency signal H to the output terminal 110.

In the local oscillator of the present embodiment, in the case of attempting to obtain a local oscillation signal with a high frequency in the output terminal 110, the PLL can be implemented by a low number of multiplications and can be operated at a frequency lower than ever before by action of the multiplying oscillator 80.

That is, the multiplying oscillator 80 can output a frequency four times a fundamental wave using an operating frequency of the PLL as the fundamental wave. As a result of this, the multiplying oscillator 80 can halve the number of multiplications of the multiplying circuit 300 as compared with a conventional push-push oscillator for outputting a second harmonic, and can reduce circuit scale and power consumption accordingly. Since the operating frequency of the PLL can be made low, it is unnecessary to use a prescaler in which power consumption increases generally and in this respect, the circuit scale and the power consumption can be reduced.

In addition, the need for the multiplying circuit 300 is eliminated when a fundamental wave of the multiplying oscillator 80 is an operating frequency of the PLL and a fourth harmonic of the multiplying oscillator 80 is a frequency which wants to be obtained in the local oscillator.

According to the fifth embodiment as described above, the local oscillator by a frequency synthesizer configuration can be constructed by combination with the phase lock circuit 200 capable of controlling a frequency of the multiplying oscillator of the invention by an electrical signal. Further, according to the fifth embodiment, by connecting the multiplying circuit 300 to an output of the multiplying oscillator 80, a local oscillation signal with a high frequency can be constructed stably and adjustably by a PLL even for power consumption and circuit scale smaller than ever before.

Sixth Embodiment

Figure 11A:
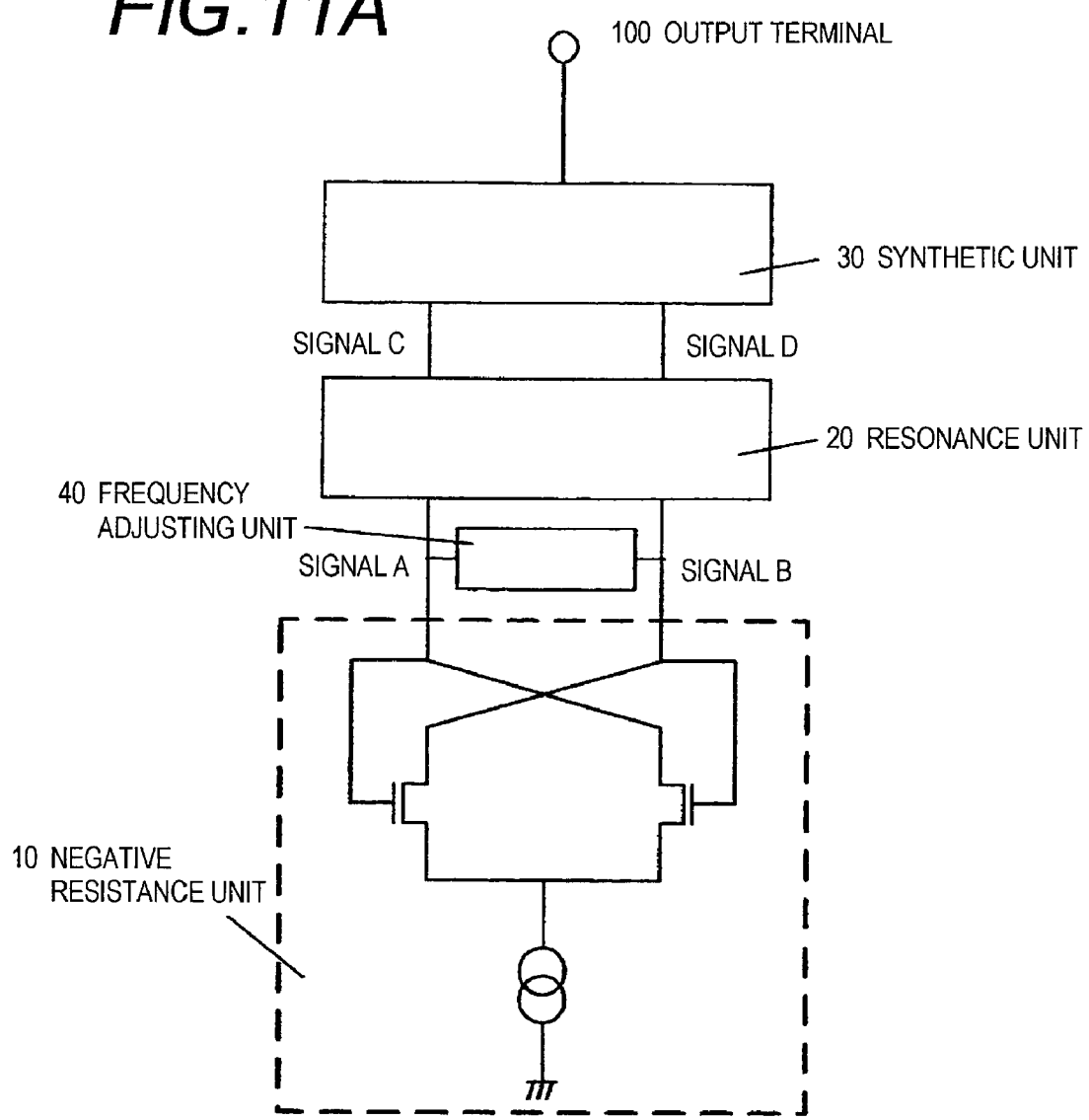
FIG. 11A is a block diagram showing a configuration of a multiplying oscillator according to a sixth embodiment.

FIG. 11A is a block diagram showing a configuration of a multiplying oscillator according to a sixth embodiment of the invention. The multiplying oscillator according to the sixth embodiment shown in FIG. 11A is configured to construct the negative resistance units 10 and 11 in the configuration of FIG. 1 by cross feedback type pair transistors.

In the present embodiment, a negative resistance unit 10 is constructed of a cross feedback type circuit in which one gate terminal of a transistor pair in which sources of two field effect transistors (FET) are coupled is connected to the other drain terminal. A negative resistance component is generated between two drain terminals of the cross feedback type circuit by applying a proper bias to the transistor, and the multiplying oscillator operates as an oscillator by connecting a resonance unit 20 between the drain terminals.

A differential type negative resistance circuit configuration using the pair transistors as shown in the present configuration insusceptible to a ground is effective in the case of forming a circuit on a substrate difficult to enhance the ground, for example, an integrated circuit on a silicon substrate.

A method of cross type feedback of the negative resistance unit 10 includes, for example, a method for making connection through an emitter follower or a capacity or a method for making direct connection as illustrated as a method of connection between a drain and a gate, and any of these methods may be used as long as negative resistance is obtained.

In the present embodiment, a frequency adjusting unit 40 is configured to be connected between a signal A and a signal B which are two outputs of the negative resistance unit 10. An effect of suppression of a second harmonic is obtained by connecting a circuit with low impedance with respect to the second harmonic.

Such a circuit includes, for example, a series resonance circuit. In FIG. 11A, the configuration of connecting the frequency adjusting unit 40 between drain terminals is described, but an operation can be performed even in the case of disposing a frequency adjusting unit shunt-connected from each terminal as described previously.

Also, as shown in FIG. 11B, it may be configured to add frequency adjusting units 40 and 41 to each of the terminals to which a signal A and a signal B which are differential oscillation signals are outputted.

A function of a resonance unit 20 or a synthetic unit 30 is the same as that of the previous embodiments. By the configurations of FIGS. 11A and 11B, the signal A and the signal B have an opposite-phase relation of a phase difference of 180° in fundamental waves and oscillate. A relation between a signal C and a signal D is similar.

A multiplying oscillator of the present embodiment shown in FIGS. 11A and 11B synthesizes this signal C and the signal D by the synthetic unit 30. The multiplying oscillator operates as the multiplying oscillator by canceling odd harmonics including a fundamental wave by opposite-phase addition and further enhancing even harmonics by in-phase addition. Further, the multiplying oscillator of the present embodiment shown in FIGS. 11A and 11B can obtain an effect of suppressing only a second harmonic which is low-order even harmonics by the frequency adjusting unit 40 or 41, and can form the multiplying oscillator capable of producing a fourth harmonic output mainly.

According to the sixth embodiment as described above, the multiplying oscillator is configured to use a transistor pair in the negative resistance unit 10 and is further configured to dispose the frequency adjusting unit 40 between output terminals of the transistor pair. As a result of this, the multiplying oscillator can have a circuit configuration insusceptible to a ground. Also, according to the sixth embodiment, the multiplying oscillator can suppress odd harmonics and a fundamental wave. Further, the multiplying oscillator can suppress a twofold harmonic level by action of the frequency adjusting unit disposed in the resonance unit. As a result, the multiplying oscillator can construct the multiplying oscillator for generating a frequency signal of even harmonics four times the fundamental wave. Since the present configuration has an advantage of being insusceptible to a ground, it is configured to have an affinity for an integrated circuit on a silicon substrate particularly.

In addition, even in a configuration in which in the transistor, an FET is replaced with a bipolar transistor and a gate is replaced with a base and a drain is replaced with a collector and a source is replaced with an emitter, a similar effect can be obtained.

Seventh Embodiment

Figure 12:
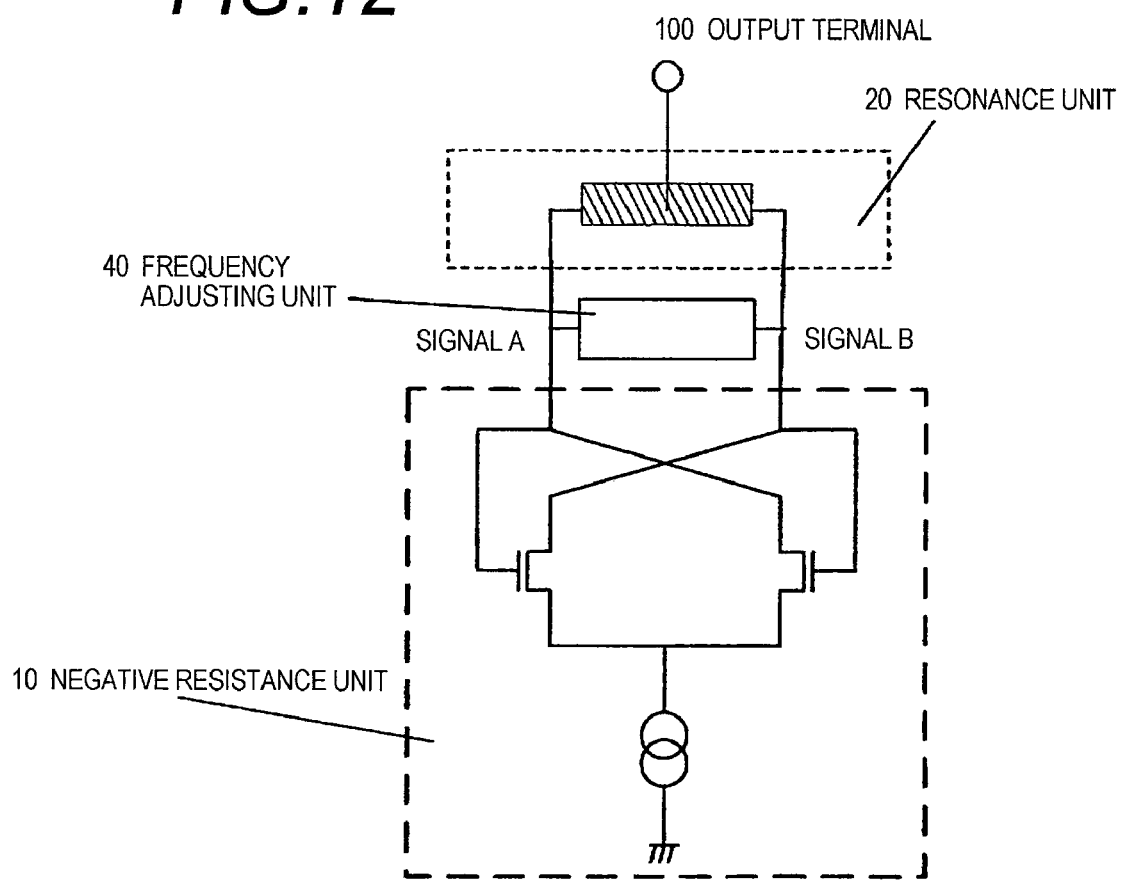
FIG. 12 is a block diagram showing a configuration of a multiplying oscillator according to a seventh embodiment.

FIG. 12 is a block diagram showing a configuration of a multiplying oscillator according to a seventh embodiment of the invention. The multiplying oscillator according to the seventh embodiment shown in FIG. 12 is configured to change the two frequency adjusting units in the configuration of FIG. 6 into one frequency adjusting unit and construct the negative resistance units 10 and 11 in the configuration of FIG. 6 by cross feedback type pair transistors.

In the present embodiment, a negative resistance unit 10 is constructed of a cross feedback type circuit in which one gate terminal of a transistor pair in which sources of two field effect transistors (FET) are coupled is connected to the other drain terminal in a manner similar to the sixth embodiment. A negative resistance component is generated between two drain terminals of the cross feedback type circuit by applying a proper bias to the transistor, and an operation as an oscillator is performed by connecting a resonance unit 20 between the drain terminals.

A differential type negative resistance circuit configuration using the pair transistors as shown in the present configuration insusceptible to a ground is effective in the case of forming a circuit on a substrate difficult to enhance the ground, for example, an integrated circuit on a silicon substrate.

A method of cross type feedback of the negative resistance unit 10 includes, for example, a method for making connection through an emitter follower or a capacity or a method for making direct connection as illustrated as a method of connection between a drain and a gate, and any of these methods may be used as long as negative resistance is obtained.

In the present embodiment, a frequency adjusting unit 40 is configured to be connected between a signal A and a signal B which are two outputs of the negative resistance unit 10. An effect of suppression of a second harmonic is obtained by connecting a circuit with low impedance with respect to the second harmonic.

In an oscillation state of the present multiplying oscillator, in a line type half-wavelength resonator of the resonance unit 20, a signal A and a signal B of both ends vibrate in a phase difference of 180° at an oscillation frequency of fundamental waves and a center point to which an output terminal 100 is connected becomes a node, so that an output level cannot be obtained in the center point. Similarly for odd harmonics, it becomes a node and an output is not produced.

On the other hand, for even harmonics, the center point becomes an antinode and a large output level enhanced can be obtained in the center point. As a result, the even harmonics can be obtained as an oscillation output without using a synthetic unit.

According to the seventh embodiment as described above, the multiplying oscillator is configured to use a transistor pair in the negative resistance unit 10 and is further configured to dispose the frequency adjusting unit between output terminals of the transistor pair, so that the circuit can have a circuit configuration insusceptible to a ground. Also, the multiplying oscillator can suppress odd harmonics and a fundamental wave by a configuration of connecting the output terminal 100 to the center point of the half-wavelength resonator of the resonance unit 20 and further, can suppress a twofold harmonic level by action of the frequency adjusting units connected to both ends of the resonator. As a result, the multiplying oscillator can compactly construct the multiplying oscillator for generating a frequency signal of even harmonics four times the fundamental wave without using the synthetic unit. Since the present configuration has an advantage of being insusceptible to a ground, it is configured to have an affinity for an integrated circuit on a silicon substrate particularly.

In addition, even in a configuration in which in the transistor, an FET is replaced with a bipolar transistor and a gate is replaced with a base and a drain is replaced with a collector and a source is replaced with an emitter, a similar effect can be obtained.

In addition, in the previous embodiments, the case of suppressing a second harmonic by the frequency adjusting unit and obtaining a fourth harmonic has been described, but it can also be constructed so as to obtain a higher-order oscillation frequency output, for example, obtain a sixth harmonic by a configuration of suppressing both of the second harmonic and the fourth harmonic by making adjustment so as to lower impedance of the frequency adjusting unit for the second harmonic and the fourth harmonic.

The invention has been described in detail with reference to the particular embodiments, but it is apparent to those skilled in the art that various changes or modifications can be made without departing from the spirit and scope of the invention.

The present application is based on Japanese patent application (patent application No. 2006-349689) filed on Dec. 26, 2006 and Japanese patent application (patent application No. 2007-324514) filed on Dec. 17, 2007, and the contents of the patent applications are hereby incorporated by reference.

INDUSTRIAL APPLICABILITY

According to the invention, in the case of attempting to obtain a signal with a high frequency of a microwave band or more mainly, the signal can be generated more compactly at lower cost with lower power consumption and lower noise than ever before. As a result of this, the invention is useful as a generation circuit etc. of a local oscillation signal of the inside of an apparatus or a wireless frequency signal in a wireless apparatus using a microwave band or a millimeter wave band. Particularly, it is useful for an apparatus etc. for providing high-speed wireless data transmission of UWB which is ultra wide band communication using the microwave band or the millimeter wave band by low power consumption or low cost.

The invention claimed is:

1. A multiplying oscillator, comprising:
a negative resistance unit having negative resistance characteristics;
a resonance unit which is connected to the negative resistance unit, and outputs first and second resonance signals of mutually opposite phases in a fundamental wave;
a frequency adjusting unit which is connected to the resonance unit, and suppresses first even harmonic of the resonance signal; and
a synthetic unit which is connected to the resonance unit, and synthesizes an in-phase component of the first and second resonance signals and cancels an opposite-phase component of the first and second resonance signals,
wherein the synthetic unit cancels odd harmonics and a fundamental wave of the resonance signals and outputs second even harmonic of the resonance signals,
wherein the frequency adjusting unit includes a first frequency adjusting unit and a second frequency adjusting unit connected to both ends of the resonance unit, respectively,
wherein the first frequency adjusting unit and the second frequency adjusting unit are respectively constructed in series connection of an adjustment inductor and a capacity for resonance and one end of the frequency adjusting unit is connected to the resonance unit and the other end is grounded,
wherein the resonance unit is a line type resonator, and
wherein the adjustment inductor is constructed of a line thinner than a line width of the line type resonator.

2. The multiplying oscillator as claimed in claim 1, wherein the first even harmonic is second harmonic and the second even harmonic is fourth harmonic.

3. The multiplying oscillator as claimed in claim 1, wherein the negative resistance unit includes a first negative resistance unit and a second negative resistance unit which are connected to both ends of the resonance unit, respectively, and have mutually the same configuration.

4. The multiplying oscillator as claimed in claim 1, wherein the resonance unit is a half-wavelength resonator.

5. A multiplying oscillator, comprising:
a negative resistance unit having negative resistance characteristics;
a resonance unit which is connected to the negative resistance unit, and outputs a resonance signal in which a center point becomes a node of a fundamental wave; and
a frequency adjusting unit which is connected to a line type resonator, and suppresses first even harmonic of the resonance signal,
wherein second even harmonic of the resonance signal is outputted from the center point of the line type resonator,
wherein the frequency adjusting unit includes a first frequency adjusting unit and a second frequency adjusting unit connected to both ends of the resonance unit, respectively,
wherein the first frequency adjusting unit and the second frequency adjusting unit are respectively constructed in series connection of an adjustment inductor and a capacity for resonance and one end of the frequency adjusting unit is connected to the resonance unit and the other end is grounded,
wherein the resonance unit is the line type resonator, and
wherein the adjustment inductor is constructed of a line thinner than a line width of the line type resonator.

6. A multiplying oscillator, comprising:
a negative resistance unit having negative resistance characteristics;
a resonance unit which is connected to the negative resistance unit, and outputs a first resonance signal and a second resonance signal of mutually opposite phases in a fundamental wave;

a frequency adjusting unit which is connected to the resonance unit, and suppresses first even harmonic of the resonance signals; and a synthetic unit which is connected to the negative resistance unit, and synthesizes an in-phase component of the first resonance signal and the second resonance signal and cancels an opposite-phase component of the first resonance signal and the second resonance signal, wherein the synthetic unit cancels odd harmonics and a fundamental wave of the resonance signals and outputs second even harmonic of the resonance signals wherein the frequency adjusting unit includes a first frequency adjusting unit and a second frequency adjusting unit connected to both ends of the resonance unit, respectively, wherein the first frequency adjusting unit and the second frequency adjusting unit are respectively constructed in series connection of an adjustment inductor and a capacity for resonance and one end of the frequency adjusting unit is connected to the resonance unit and the other end is grounded, wherein the resonance unit is a line type resonator, and wherein the adjustment inductor is constructed of a line thinner than a line width of the line type resonator.

7. A multiplying oscillator, comprising:

a negative resistance unit having negative resistance characteristics;

a resonance unit which is connected to the negative resistance unit, and outputs first and second resonance signals of mutually opposite phases in a fundamental wave;

a frequency adjusting unit which is connected to the resonance unit, and suppresses first even harmonic of the resonance signal; and a synthetic unit which is connected to the resonance unit, and synthesizes an in-phase component of the first and second resonance signals and cancels an opposite-phase component of the first and second resonance signals, wherein the synthetic unit cancels odd harmonics and a fundamental wave of the resonance signals and outputs second even harmonic of the resonance signals, wherein the frequency adjusting unit is constructed in series connection of an adjustment inductor and a capacity for resonance and is connected between both ends of the resonance unit.

8. The multiplying oscillator as claimed in claim 1, wherein the negative resistance unit is constructed of a differential pair in which emitter or source terminals of two transistors are connected.

9. A multiplying oscillator, comprising:

a negative resistance unit having negative resistance characteristics;

a resonance unit which is connected to the negative resistance unit, and outputs first and second resonance signals of mutually opposite phases in a fundamental wave;

a frequency adjusting unit which is connected to the resonance unit, and suppresses first even harmonic of the resonance signal; and a synthetic unit which is connected to the resonance unit, and synthesizes an in-phase component of the first and second resonance signals and cancels an opposite-phase component of the first and second resonance signals, wherein the synthetic unit cancels odd harmonics and a fundamental wave of the resonance signals and outputs second even harmonic of the resonance signals, wherein the frequency adjusting unit includes a first frequency adjusting unit and a second frequency adjusting unit connected to both ends of the resonance unit, respectively, wherein the first frequency adjusting unit and the second frequency adjusting unit are respectively constructed in series connection of an adjustment inductor and a capacity for resonance and one end of the frequency adjusting unit is connected to the resonance unit and the other end is grounded, wherein the capacity for resonance is a variable capacity diode in which an oscillation frequency is changed by a control voltage.

10. The multiplying oscillator as claimed in claim 1, wherein a fundamental component of the resonance signal is outputted as a signal for phase lock circuit.

11. A multiplying oscillator, comprising:

a negative resistance unit having negative resistance characteristics;

a resonance unit which is connected to the negative resistance unit, and outputs first and second resonance signals of mutually opposite phases in a fundamental wave;

a frequency adjusting unit which is connected to the resonance unit, and suppresses first even harmonic of the resonance signal; and a synthetic unit which is connected to the resonance unit, and synthesizes an in-phase component of the first and second resonance signals and cancels an opposite-phase component of the first and second resonance signals, wherein the synthetic unit cancels odd harmonics and a fundamental wave of the resonance signals and outputs second even harmonic of the resonance signals, wherein fundamental components of the first resonance signal and the second resonance signal are outputted as a differential signal for phase lock circuit.

12. A wireless apparatus in which the multiplying oscillator as claimed in claim 9 and a local oscillator including a phase lock circuit are installed, wherein the multiplying oscillator supplies a fundamental component of the resonance signal to the phase lock circuit, and wherein the phase lock circuit supplies a control signal for changing a capacity of the variable capacity diode to the multiplying oscillator, and operates at a fundamental frequency of the resonance signal.

13. The wireless apparatus as claimed in claim 12, comprising a multiplier for multiplying a frequency of an output signal of the multiplying oscillator by an integer of two or more.

* * * * *